(12) United States Patent
Bosshart

(10) Patent No.: US 6,231,147 B1
(45) Date of Patent: May 15, 2001

(54) DATA STORAGE CIRCUITS USING A LOW THRESHOLD VOLTAGE OUTPUT ENABLE CIRCUIT

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/294,280

(22) Filed: Apr. 19, 1999

(51) Int. Cl.[7] .................................................. H03K 3/289
(52) U.S. Cl. ............................................ 328/202; 327/212
(58) Field of Search .................................... 327/185, 199, 327/200, 201, 202, 203, 208, 210–212, 214, 215, 218; 365/154, 156

(56) References Cited

U.S. PATENT DOCUMENTS

| | | | |
|---|---|---|---|
| 5,600,588 | * 2/1997 | Kawashima | 365/154 |
| 5,939,915 | * 8/1999 | Curran | 327/202 |
| 5,982,211 | * 11/1999 | Ko | 327/202 |

* cited by examiner

*Primary Examiner*—Timothy P. Callahan
*Assistant Examiner*—Minh Nguyen
(74) *Attorney, Agent, or Firm*—Robert D. Marshall, Jr.; W. James Brady, III; Frederick J. Telecky, Jr.

(57) ABSTRACT

A data storage circuit (30) has a data input (12') for receiving a data voltage (D') and a node (17') for receiving an interim voltage in response to the data voltage. The data storage circuit also includes an output enable circuit (32) for providing at least one conditional path coupled to the node and for coupling the interim voltage to the node. The output enable circuit has a transistor (32p) having a first threshold voltage and operable to provide a conductive path along the at least one conditional path. The data storage circuit also includes a data output (19') for providing an output voltage in response to the interim voltage at the node and a data retention circuit coupled between the node and the data output. The data retention circuit (18' and 20') has at least one transistor having a second threshold voltage higher in magnitude than the first threshold voltage.

3 Claims, 3 Drawing Sheets

DATA STORAGE CIRCUITS USING A LOW THRESHOLD VOLTAGE OUTPUT ENABLE CIRCUIT

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to data storage circuits, and are more particularly directed to circuits such as registers and latches using a low threshold voltage output enable circuit.

In many modern circuit applications it is desirable to improve the speed of operation of the circuit application, and a common circuit application to which this desire applies is a register. A register is typically considered a device that is able to store information over time, where the storage time associated with the register is often one clock cycle. For further background FIG. 1 illustrates a schematic of a register designated generally at 10, where the following first discusses the components of register 10 followed by a description of its operation.

Register 10 includes an input 12 for receiving data D and an input 14 for receiving a clock signal CLK. Turning first to input 12, it is connected to a first output enable circuit 16, where circuit 16 is sometimes referred to in the art by other names such as a passgate or a transmission gate. In any event, output enable circuit 16 consists of a p-channel transistor 16p and an n-channel transistor 16n. A first source/drain of each transistor in circuit 16 is connected to input 12, and a second source/drain of each of those transistors is connected to a node 17 which is further connected to an input of an inverter 18. The output of inverter 18 is connected to the input of a feedback inverter 20, and the output of feedback inverter 20 is connected to the input of inverter 18. The output of inverter 18 is also connected to a node 19 which is connected to the input of a second output enable circuit 22. Second output enable circuit 22 consists of a p-channel transistor 22p and an n-channel transistor 22n. A first source/drain of each transistor in second output enable circuit 22 is connected to the output of inverter 18, and a second source/drain of each of those transistors is connected to a node 23 which is further connected to an input of an inverter 24. The output of inverter 24 is connected to the input of a feedback inverter 26, and the output of feedback inverter 26 is connected to the input of inverter 24. In addition, the output of inverter 24 provides the data output Q for register 10. Lastly, the clock signal CLK at input 14 is used to clock the transistors of output enable circuits 16 and 22. More particularly, input 14 is connected directly to the gates of p-channel transistor 16p and n-channel transistor 22n, and further to the input of an inverter 28. The inverted clock signal (shown in FIG. 1 as $\overline{CLK}$) from the output of inverter 28 is connected to the gates of n-channel transistor 16n and p-channel transistor 22p.

The operation of register 10 is now described and is also illustrated with reference to the timing diagram of FIG. 2, where FIG. 2 across its top illustrates the clock signal CLK applied to register 10. Generally, CLK is periodic with a fifty percent duty cycle during typical active mode operations, and as seen below the CLK transitions thereby cause data to pass through register 10. However, by way of introduction to an important notion detailed later, note that the clock period is also shown for an extended time period between a time $t_8$ and a time $t_9$ to stay constant rather than cycling and, in the present example, to remain at a low level during this period. During this period, and as further appreciated below, register 10 remains inactive.

Turning now to the data transfer through register 10 during the active mode of operation, the following demonstrates the passage of data D from input 12 through the first stage of register 10, where that stage consists of output enable circuit 16 as well as the two-inverter combination following it. To further discuss this data transfer, attention is first directed to the second row in FIG. 2, which illustrates the data D coupled to input 12. For simplicity sake, prior to time $t_0$ unknown data is shown as input although CLK is active prior to $t_0$. At $t_0$, a first data bit D1 is input to register 10. Further, at $t_0$, note that CLK is low and is applied to the gate of p-channel transistor 16p, while its inverted form, $\overline{CLK}$, is applied to the gate of n-channel transistor 16n. As a result, after some delay represented in FIG. 2 between $t_0$ and $t_1$, the low clock and its complement are enabling to one or both of transistors in output enable circuit 16, which thereby passes D1 from input 12 to node 17 as is shown by the third row in FIG. 2. Note that the term "enabling" is known in the art, and indicates that the gate potential is sufficient to cause conduction along the conductive path (i.e., the source/drain) of the transistor to which the gate potential is connected. Next, D1 at node 17 passes through and is inverted by inverter 18, which thereby adds a one inverter delay to the signal as it continues to pass through register 10 and appears as $\overline{D1}$ at node 19, as shown at $t_2$ in the fourth row in FIG. 2. At this point, therefore, one skilled in the art will appreciate that the data $\overline{D1}$ is effectively latched at node 19, and its state is further retained by the feedback operation of inverter 20. In this regard, therefore, the combination of inverters 18 and 20 are referred to in this document as a data retention circuit.

Continuing with the data transfer through register 10, the following completes the passage of data D through the second stage of register 10, where that stage consists of output enable circuit 22 as well as the two-inverter combination following it. Once again looking to FIG. 2, at time $t_3$ CLK rises to a high level, and this transition and new level is applied to the gate of n-channel transistor 22n, while its inverted form, $\overline{CLK}$, is applied to the gate of p-channel transistor 22p. As a result, after some delay represented in FIG. 2 between $t_3$ and $t_4$, output enable circuit 22 operates via one or both of its transistors to pass $\overline{D1}$ from node 19 to node 23 as is shown in the fifth row of FIG. 2. Next, $\overline{D1}$ at node 23 passes through and is inverted by inverter 24, which thereby adds a one inverter delay to the signal and thereby concludes the path through register 10 since the data D then appears at output Q, as shown at $t_5$ in the final row of FIG. 2. At this point, therefore, data D1 is latched at output Q with its state further maintained by the feedback operation of inverter 26, and that data may then be sampled by another circuit or the like requiring access to that data.

Having now demonstrated the passage of D1 through register 10 during its active mode of operation, the discussion of the operation of register 10 is now concluded with a more detailed examination of its inactive mode. Specifically, after CLK goes low starting at $t_6$, and following the other transitions through register 10 as described above, then from $t_8$ 1 to $t_9$ there are no active transitions in register 10 since CLK remains low. During this time, therefore, the state of register 10 is unchanged. By way of introduction to an inventive aspect described later, however, it is noted that some of the transistors forming register 10 are conducting during this time, while other transistors are not. Finally, at $t_9$, register 10 switches back to the active mode when CLK again transitions, and the next data bit, shown as D2 in FIG. 2, is then processed in the same manner described above with respect to D1.

While register 10 and its operation has been long used and established in the art, recall that at the outset of this Background section it was noted that speed through devices is a key consideration. Further, note now that a register may indeed be a key component in many of the critical paths of a system where speed is desirable. Indeed, in the context of registers there is often an analysis of various attributes such as set up time and hold time, where these two attributes combine to form the throughput time of the device. Given these attributes, it is most often the goal to reduce the throughput time of the device, that is, to improve the speed of operation of the register. Accordingly, the present inventor endeavors in the preferred embodiments to reduce the data throughput time of a register such as register 10 or other storage circuits detailed later, while further attempting to minimize or avoid any tradeoff that may present itself from the speed improvement.

By way of further background to speed enhancements, it is noted that some techniques exist in general circuit design to increase device speed. For example, the sizes of transistors may be increased to produce a corresponding increase in device speed. As another example, one performance technique currently in use in manufacturing is to target the threshold voltage of transistors given certain circuit expectations. Particularly, typically a manufacturer will build transistors, or make available transistor fabrication processes, which include transistors of a given threshold voltage. When providing this process, the manufacturer typically considers the tradeoff in speed improvement versus power consumption. To increase operational speed, it is known that the threshold voltage of all of the transistors within a circuit may be reduced. By reducing the threshold voltage, the drive current of these transistors is increased and, hence, the throughput time is improved.

While the above approaches are representative of the art for advancing circuit operational speed, they provide various limitations or drawbacks. For example, increasing transistor sizes creates higher cost in area and power. As another example, by reducing the threshold voltage of all transistors in a circuit, the leakage current of the circuit is also increased. Moreover, the ability to lower all transistor threshold voltages becomes even more limiting as power supply voltages are reduced and the threshold voltage of the transistor becomes a greater percentage of the power supply voltage. Still further, leakage current becomes a greater concern when there are inactive or standby periods, particularly where those periods may be relatively long. Thus, often a manufacturer anticipates a certain level of leakage to be the acceptable limit, and in view of that limit, adjusts known parameters so that each of the transistors of the circuit share a designated threshold voltage which will not exceed that limit.

The inventor of the present embodiments has recognized the above considerations and below are set forth embodiments which provide increased circuit speed while reducing leakage current as compared to the current state of the art.

BRIEF SUMMARY OF THE INVENTION

In the preferred embodiment, there is a data storage circuit. The data storage circuit comprises a data input for receiving a data voltage and a node for receiving an interim voltage in response to the data voltage. The data storage circuit also comprises an output enable circuit for providing at least one conditional path coupled to the node and for coupling the interim voltage to the node. The output enable circuit comprises a transistor having a first threshold voltage and operable to provide a conductive path along the at least one conditional path. The data storage circuit also comprises a data output for providing an output voltage in response to the interim voltage at the node and a data retention circuit coupled between the node and the data output. The data retention circuit comprises at least one transistor having a second threshold voltage higher in magnitude than the first threshold voltage. Other circuits and systems are also disclosed and claimed.

DETAILED DESCRIPTION OF THE INVENTION

Figure 1:
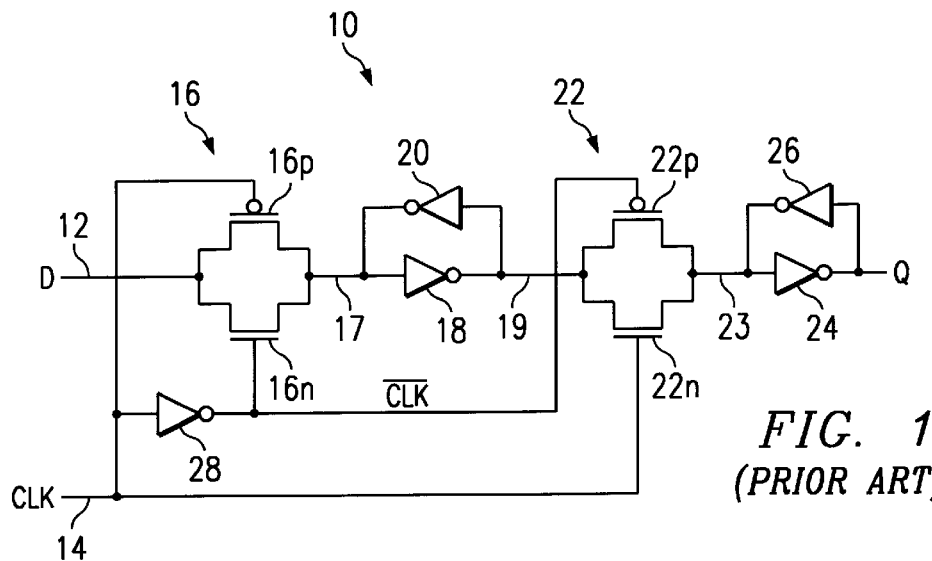
FIG. 1 illustrates a schematic of a prior art register.
Figure 2:
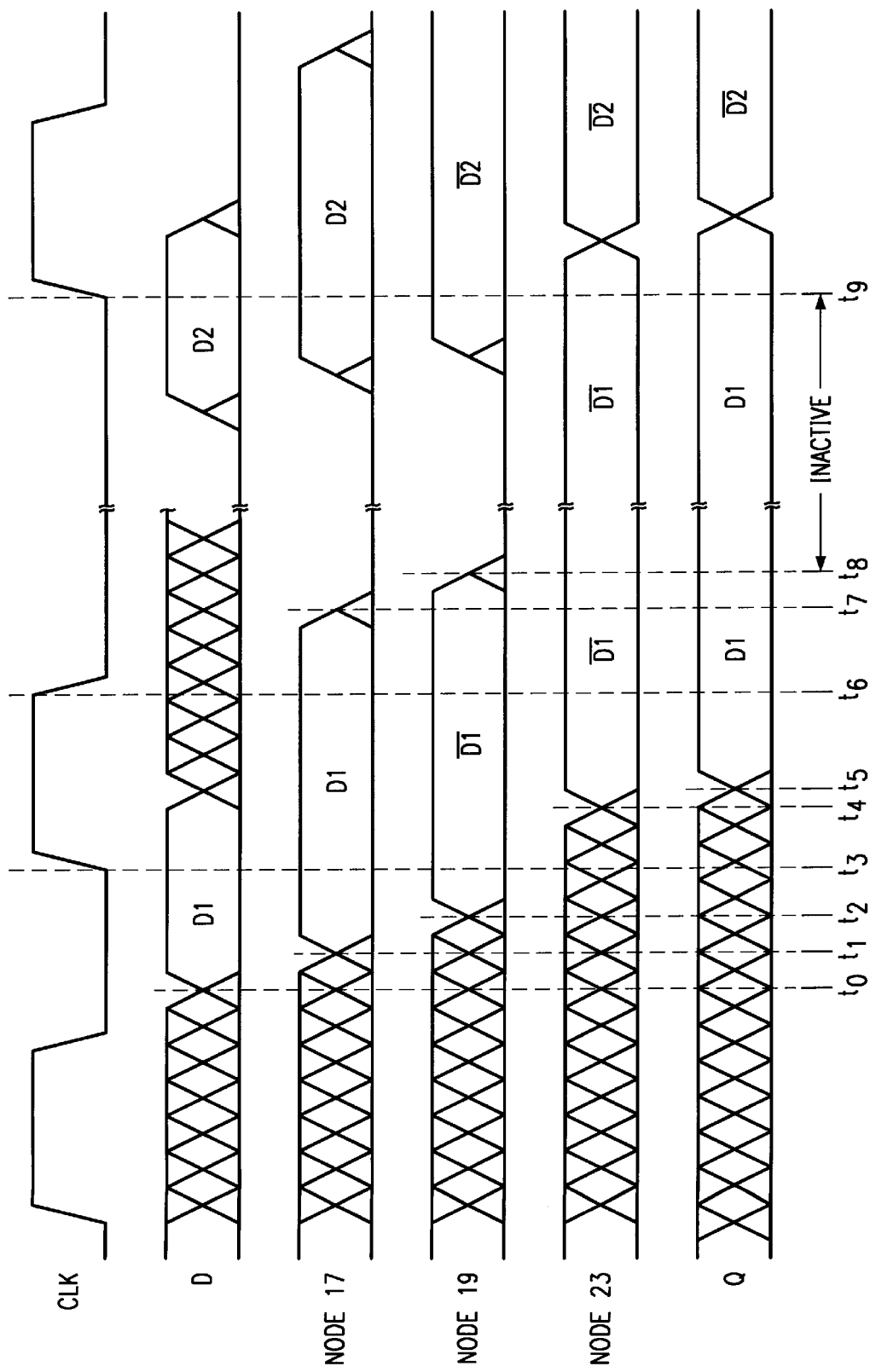
FIG. 2 illustrates a timing diagram of the operation of the register of FIG. 1.

FIGS. 1 and 2 were discussed in the above Background relative to the prior art. In addition, before proceeding with the various embodiments presented in the Figures described below, recall from the above Background that the current state of the art requires a tradeoff such that an improvement in circuit speed by lowering transistor threshold voltages undesirably increases current leakage. Conversely, an improvement in current leakage by raising transistor threshold voltages undesirably reduces circuit speed. In contrast, however, the following embodiments improve circuit speed without correspondingly increasing current leakage as compared to the prior art configuration described above.

Figure 3:
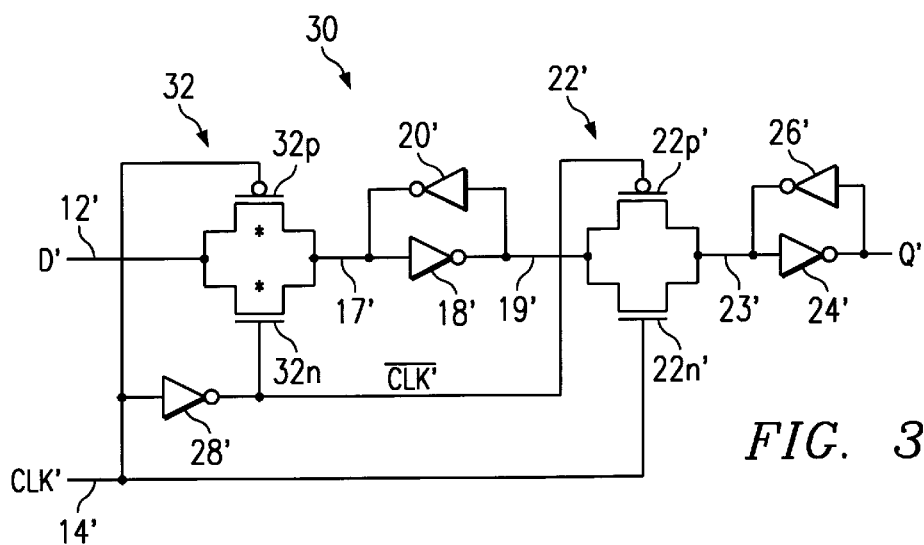
FIG. 3 illustrates a schematic of a first embodiment of an inventive register.

FIG. 3 illustrates a first embodiment of an inventive register designated generally at 30. In various respects, register 30 has like components and connections as compared to register 10 of FIG. 1. For sake of simplicity, therefore, the reference numerals of such components are carried forward from FIG. 1 to FIG. 3, but an apostrophe is added to each such number so that the items may be referred to without creating confusion given the use of the same numbers in connection with FIG. 1. Assuming that the reader is familiar with FIG. 1, the carried-forward items of register 30 are only briefly discussed below, and the emphasis and detail is instead focused on those items which differ from the prior art and give rise to the improvements over such art.

Turning now to register 30 and more particularly to its first stage, it includes a data input 12' for receiving data D' and an input 14' for receiving a clock signal CLK'. Input 12' is connected to a first output enable circuit 32, which like circuit 16 in the prior art may be referred to by other names such as a passgate or a transmission gate. Output enable circuit 32 consists of a p-channel transistor 32p and an n-channel transistor 32n. Here, however, note that an asterisk is placed by each of the transistors in output enable circuit 32. This convention is explained in detail below to further demonstrate the inventive scope, but is introduced at this point to indicate that these transistors differ relative to transistors 16p and 16n of the prior art. A first source/drain of each transistor in circuit 32 is connected to input 12', and a second source/drain of each of those transistors is connected to a node 17'.

The remaining components of register 30 form its second stage and are the same and are connected in the same manner as described earlier in connection with register 10 of FIG. 1. Briefly, therefore, node 17' is connected to an input of an inverter 18' which has its output connected to the input of a feedback inverter 20', where the output of feedback inverter 20' is connected to the input of inverter 18'. The output of inverter 18' is also connected to a node 19', with a second output enable circuit 22' connected between node 19' and a node 23' Output enable circuit 22' consists of a p-channel transistor 22p' and an n-channel transistor 22n', where a first source/drain of each such transistor is connected to node 19' and a second source/drain of each such transistor is connected to node 23'. Node 23' is further connected to an input of an inverter 24', which has its output connected to the input of a feedback inverter 26' having its output connected to the input of inverter 24'. In addition, the output of inverter 24' provides the data output Q' for register 10. Lastly, the clock signal CLK' at input 14' is used to clock the transistors of output enable circuits 32 and 22'. More particularly, input 14' is connected directly to the gates of p-channel transistor 32p and n-channel transistor 22n', and further to the input of an inverter 28'. The inverted clock signal (shown in FIG. 1 as $\overline{CLK}'$) from the output of inverter 28' is connected to the gates of n-channel transistor 32n and p-channel transistor 22p'.

Turning now to a key difference between register 30 and the prior art register 10, recall that asterisks are shown by p-channel transistor 32p and n-channel transistor 32n. In the preferred embodiment, the threshold voltage ("$V_T$") of these asterisk-designated transistors is lower than other transistors in register 30, such as relative to p-channel transistor 22p' and n-channel transistor 22n' of output enable circuit 22'. Note that the use of an asterisk in this manner, that is, to designate a low threshold voltage transistor, is followed in the remainder of the Figures as well. Before detailing the significance of the use of a low threshold voltage transistor versus a high threshold voltage transistor, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it provides a first amount of drive current at a given drain-to-source voltage (with its gate connected to its drain). For a second transistor with a second threshold voltage lower than that of the first transistor, the second transistor provides a second amount of drive current at the given drain-to-source voltage (with its gate connected to its drain), and which drive current is larger than the first amount of drive current provided by the first transistor at that same drain-to-source voltage. For the remainder of this document, a transistor of the first type will be referred to as an HVT transistor (i.e., a transistor with a relatively high $V_T$) while a transistor of the second type will be referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. Note also that although an LVT transistor provides the benefit of a higher drive current as opposed to an HVT transistor, in contrast it gives rise to the detriment that it may provide a greater leakage current than an HVT transistor. Indeed, the typical leaking by an LVT transistor may be greater than that of an HVT transistor by two or three orders of magnitude or more.

Returning now to FIG. 3, recall from the asterisks that the transistors of output enable circuit 32 are LVT transistors while the transistors of output enable circuit 22 are HVT transistors (as may be most or all of the other transistors in register 30). This distinction is in stark contrast to the prior art, where each of the transistors of a configuration such as in FIG. 1 were constructed to have the same high $V_T$ (i.e., to avoid the unacceptably large leakage current which would exist if a lower $V_T$ were used). Before proceeding with the benefits of the above-stated distinction where the present embodiments use both HVT and LVT transistors, note then that the embodiments described in this document may be constructed in various manners in order to accomplish different transistors having differing threshold voltages, with a few examples of such approaches discussed below.

As a first example for creating both LVT and HVT transistors in a given circuit, one manner of accomplishing this goal could be using a manufacturing process which specifically permits the creation of transistors having differing threshold voltages. For example, in current technology, typically a single semiconductor area (e.g. a wafer) is masked and the exposed areas are subjected to an implant which establishes the threshold voltage for the exposed transistor channels of a first conductivity type. For example, the $V_T$ of all n-channel transistors may be set by using this process, and then repeating it with a different mask set for all p-channel transistors. Thus, using two implant steps, the $V_T$ is set for both n-channel and p-channel transistors. Additionally, for both conductivity types, the depth and/or concentration of the implant used in this manner affects the level of the threshold voltage resulting from the exposure. Under current standards, a common transistor may have a $V_T$ on the order of 500 millivolts. The methodology, however, may be expanded to provide at least two different sets of transistors, where both sets have the same conductivity type but one set includes HVT transistors while the other includes LVT transistors. Using this expanded methodology, and for one conductivity type, a first set of masks could be used to create a set of HVT transistors in the appropriate locations while a second set of masks could be used to create a set of LVT transistors in differing locations. Thus, for a given transistor conductivity types, one implant would take place using the first set of masks to create the HVT transistors. Thereafter, another implant would take place using the second set of masks to create the LVT transistors. Additionally, for a second transistor conductivity type, two more sets of masks and implants would be employed in a like manner. Moreover, to contrast with the 500 millivolt $V_T$ of the HVT transistors, current transistor technology may expect a $V_T$ on the order of 200 millivolts for an LVT transistor. Moreover, these values may vary according to various considerations known in the art.

As a second example for creating both LVT and HVT transistors in a given circuit, some transistors are formed using what is known as silicon-on-insulator ("SOI") technology. In this technology, each SOI transistor includes a separate body connection. Typically, the body is either connected to a certain node, or is allowed to float. The inventor of the present embodiments has further appreciated that this separately-available connection may be used further to accomplish the relative $V_T$ standards set forth in this document, and that additional considerations in this regard may arise in the future once the levels of $V_{DD}$ fall below a diode forward-bias voltage level for such a transistor. Given current $V_{DD}$ levels, which are still considerably higher than a typical forward-bias voltage of about 0.8 volts, and where it is desired to create an LVT configuration, it is acceptable to disconnect the transistor body, thereby allowing it to float. Conversely, given the same $V_{DD}$, and where it is desired to create an HVT configuration, it is acceptable to connect the transistor body to ground for an n-channel transistor (or to $V_{DD}$ for a p-channel transistor). In addition to the above, note that at some point in the future $V_{DD}$ levels should fall to 0.5 volts or less and, therefore, fall considerably below a typical expected forward-bias voltage of 0.8 volts. In this instance, and where it is desired to create an LVT configuration, it will as before be acceptable to disconnect the transistor body, thereby allowing it to float. As a result, the threshold voltage of that transistor is relatively low. In contrast, where it is desired to create an HVT configuration, the transistor body may be connected to the transistor's gate if that transistor is known to be off during a certain time period. For example, for n-channel transistor 22n', assuming it were formed as an SOI transistor, then the low gate voltage when the clock signal is low is also connected to the body of that transistor. As a result, the threshold voltage of that transistor is relatively high during times when CLK is low. Indeed, a relatively higher $V_T$ also may be accomplished by connecting the transistor body to a potential which is non-enabling for the transistor (e.g., connect the body to ground for an n-channel transistor), or to a different signal which is at ground during the time when the transistor is not enabled. Still other techniques should be ascertainable by a person skilled in that art and the particular technique chosen need not be detailed herein. For example, there are currently manufacturing techniques used in static circuits where certain transistors may be LVT transistors while other transistors may be HVT transistors. These techniques are presently used so that an entire area, such as a set of circuits on an entire circuit die, are constructed using LVT transistors to increase the speed of that set of circuits, but with the recognition that the area constructed in this fashion will have an increased amount of current leakage as compared to the remaining areas on the circuit die which are constructed using HVT transistors. Thus, by modifying this technique or using other techniques available to a person skilled in the art, for purposes of the present embodiments it need be possible that a given circuit may be constructed by intentionally specifying differing threshold voltages for different transistors with the choice of either LVT or HVT transistors within a circuit configuration guided by the embodiments set forth in this document.

Having introduced the concept of mixed HVT and LVT transistor circuitry, it now will be appreciated that the inventor of the present embodiments has recognized the principles set forth above, and created various unique embodiments that benefit from certain attributes of data storage operation and the benefits of combining both HVT and LVT transistors. These benefits may be realized now by reviewing the detailed operation of the differing threshold voltage transistors in register 30. In this regard, register 30 generally operates in the same manner as register 10. To appreciate the benefits of register 30, therefore, the reader is assumed familiar with the earlier discussion of FIG. 2, where both the active and inactive modes of operation are described. Given a general understanding of these modes, the following discussion demonstrates the effects of the mixed HVT and LVT transistors of register 30 by first addressing the active mode of operation and second addressing the inactive mode of operation.

Figure 4:
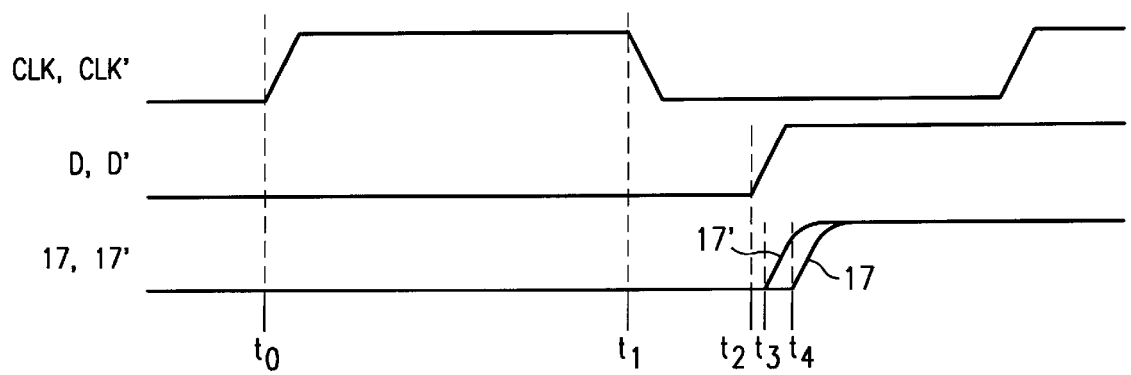
FIG. 4 illustrates a timing diagram contrasting the improved throughput time of the register of FIG. 3 versus that of the throughput time of the register of FIG. 1.

During the active mode of operation, CLK' cycles between low and high levels. In response to CLK' transitioning low, one or both of p-channel transistor 32p and n-channel transistor 32n of output enable circuit 32 are enabled, thereby passing data D' from input 12' to node 17'. Thus, a conditional path is provided between input 12' and node 17', with the condition being satisfied when CLK' is low and based on the resulting gate-to-source potential across p-channel transistor 32p and n-channel transistor 32n. Moreover, recall for the preferred embodiment that these transistors are LVT transistors. As a result, in comparison to the higher threshold voltage transistors of output enable circuit 16 in the prior art, the transistors of output enable circuit 32 switch faster. To further illustrate this aspect, FIG. 4 illustrates a timing diagram to demonstrate the contrast in response time between output enable circuit 30 versus that of the prior art (i.e., output enable circuit 16). Moreover, note that FIG. 4 is not necessarily drawn to scale, but is intended only as a representation of the relative difference between the speed of these circuits. Specifically, the top row of FIG. 4 illustrates the clock signals for both register 10 of the prior art and register 30 as the present embodiment. Thus, at time $t_0$, the clock signals begin a transition toward high and a time $t_1$ the clock signals begin a transition toward low. Following $t_1$ and more specifically at $t_2$, the second row of FIG. 4 illustrates a data transition for both circuits 10 and 30, that is, for both D and D', respectively. For the sake of simplifying the illustration, the data transition is shown by way of example as a transition from low to high. The bottom row of FIG. 4, however, demonstrates the difference in response time as will occur at node 17 versus node 17'. Specifically, because output enable circuit 32 is formed using LVT transistors, the transition at node 17' from low to high begins at $t_3$. In contrast, because output enable circuit 16 is formed using HVT transistors, the transition at node 17 from low to high begins at a later time $t_4$. In conclusion, therefore, the difference between $t_3$ and $t_4$ represents the increase in the speed of operation of output enable circuit 32. Moreover, this time savings ultimately reflects on the overall speed of operation of the register and, thus, may be realized at output Q' as well. For example, since the response time of output enable circuit 32 is improved over the prior art, then there is the possibility of increasing the frequency of the clock signal CLK', thereby increasing the speed of register 30 as a whole. Quite naturally, therefore, this time savings is realized by any larger circuit that includes register 30 and relies on its data output. As an additional matter, it is noted that the voltage and response as occurring at node 17' may be considered an interim voltage and response because it is also inverted by inverter 18' to create a comparable, but inverted, response and final voltage at node 19'. Further, the state at node 19' is also retained by the feedback operation of inverter 20' even later when CLK' transitions high. Accordingly, the combination of inverters 18' and 20' are referred to in this document as a data retention circuit. Further in this regard and as discussed briefly later, it should be understood that one skilled in the art may develop other structures to form a data retention circuit for retaining data at a node while still applying the present inventive teachings. Lastly, it is noted that the operation of the second stage of register 30 is the same as described earlier and, thus, it is not detailed further here. Of course, the improved performance of the first stage benefits register 30 as a whole in that data is more quickly available to the second stage of register 30.

Turning now to the inactive mode of operation, it is further shown that the use of LVT transistors in output enable circuit 30 does not bring with it a penalty in current leakage of a magnitude that might be expected by having reduced the threshold voltage of transistors in the data path. More particularly, recall that FIG. 2 introduces the notion of an inactive mode of operation. Further, for the example of FIG. 2, the clock signal CLK is low. Similarly, therefore, for the inventive register 30 it should be assumed that the clock signal CLK' is low for the inactive mode of operation. Accordingly, in the inactive mode it is known that an enabling low potential is applied to the gate of p-channel transistor 32p and its complement, an enabling high potential, is applied to the gate of n-channel transistor 32n. Thus, output enable circuit 30 may be considered to be in the on state during the inactive mode. In the art it is known, however, that for an on device current leakage is not of concern. As a result, during the inactive mode of operation register 30 does not show excess current leakage, despite the selective use of LVT transistors because those LVT transistors are on during the inactive mode and, hence, do not implicate leakage. Moreover, while FIG. 3 illustrates only a single register 30, the same clocking aspect may be used for groups of registers or on an entire chip or system. In other words, for each of those register devices where it is known that they include an output enable circuit connected to receive an enabling signal during the inactive mode of operation, the transistors of that output enable circuit may be LVT transistors to increase device speed without increasing current leakage during the inactive mode of operation.

An alternative embodiment is now discussed and should be appreciated given the preceding discussion of the inactive mode of operation of register 30. Specifically, the above demonstrates that a known low clock signal CLK' results in output enable circuit 32 being in the on state during the inactive mode. Accordingly, an alternative embodiment within the present inventive scope arises where it is instead known that CLK' is high during the inactive mode. In this case, it is known that output enable circuit 22' is on during the inactive mode, while output enable circuit 32 is off. As a result, for this alternative embodiment the transistors of output enable circuit 22' are LVT transistors while the transistors of output enable circuit 32 are HVT transistors. Consequently, again during the inactive mode it is known that an enabling potential, here from the high value of CLK', is applied to the gates of LVT transistors in an output enable circuit. Accordingly, during the inactive mode of operation this alternative register does not show excess current leakage despite the selective use of LVT transistors, and during the active mode of operation these LVT transistors increase device speed.

As still another alternative, recall it was mentioned earlier that one skilled in the art may develop alternative structures to form a data retention circuit. One such alternative, by way of example, includes the inverter and feedback inverter combination shown by inverters 18' and 20', and further includes a passgate connected between the output of feedback inverter 20' and node 17'. More particularly, it has been observed in other circuits that where a node such as node 17' drives a feedback inverter combination such as provided by inverters 18' and 20', then to accomplish a state change node 17' may in effect have to compete with the feedback effect of inverter 20'. To avoid this conflict, the alternative embodiment that includes a passgate between node 17' and the output of feedback inverter 20' is implemented and is controlled to gate the path of the data so that the effect of the feedback inverter 20' is effectively removed from the circuit while node 17' is being driven by first output enable circuit 32. In other words, the passgate is opened while a data value is established at node 17' by first output enable circuit 32. Thereafter, the established value drives the input to inverter 18', and only then is the passgate closed so that feedback inverter 20' is effectively placed into the conductive path and then further retains the data at node 17'. Still further alternatives are left to one skilled in the art.

Figure 5:
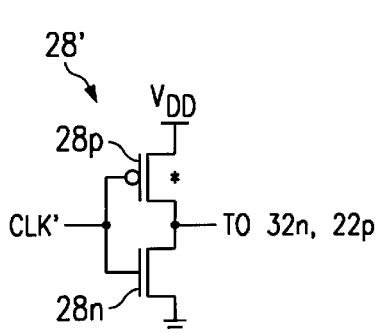
FIG. 5 illustrates a schematic of the inverter used to invert the clock signal in the register of FIG. 3.

FIG. 5 illustrates a further enhancement for register 30 and, more particularly, illustrates inverter 28' in greater detail. In general, inverter 28' is formed according to a known schematic for creating an inverter and, in this regard, includes a p-channel transistor 28p and an n-channel transistor 28n. More particularly, a first source/drain of p-channel transistor 28p is connected to a supply voltage, $V_{DD}$, and a second source/drain of p-channel transistor 28p is connected to a first source/drain of n-channel transistor 28n. A second source/drain of n-channel transistor 28n is connected to ground. The gates of transistors 28p and 28n are connected together and receive the clock signal CLK', and the output of inverter 28' is provided by the node formed by the mutually connected source/drains of the transistors.

In accordance with the present inventive embodiments, inverter 28' differs from the prior art in that p-channel transistor 28p, as indicated by the asterisk convention of this document, is an LVT transistor while n-channel transistor 28n is an HVT transistor. This selection is consistent with the earlier teachings relating to the enabling potential of the clock signal CLK' during the inactive mode. More particularly, returning to the earlier example where CLK' is known to be low for register 30 during the inactive mode, then as applied to inverter 28' this signal is enabling to p-channel transistor 28p during that mode. As a result, p-channel transistor 28p is another transistor in register 30 that is known to be in the on state during the inactive mode and, hence, the embodiment of FIG. 5 implements that transistor as an LVT transistor. Further, during the active mode of operation, this LVT selection provides a transistor that drives more current and, hence, switches faster, than an HVT transistor such as n-channel transistor 28n. Accordingly, once more a speed enhancement may be achieved with register 30 by implementing this further modification of FIG. 5.

Figure 6:
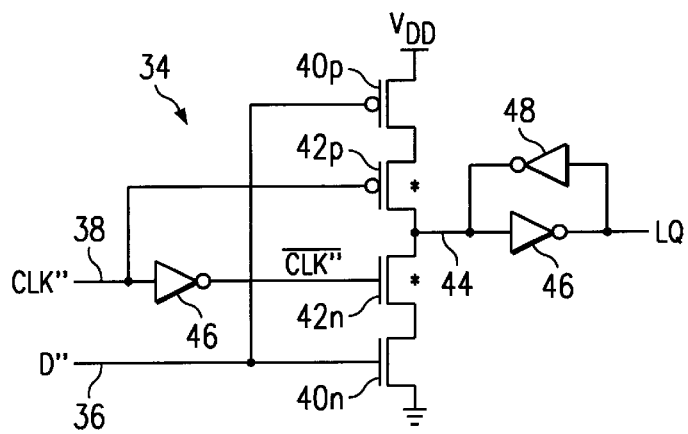
FIG. 6 illustrates a schematic of an embodiment of an inventive latch wherein the input data drives transistor gates rather than source/drains.

FIG. 6 illustrates another embodiment of an inventive latch designated generally at 34, where latch 34 may be a stand alone latching device or may be used as a first stage connected to a comparable second stage whereby the two stages combine to form a register. Looking to the devices and connections of latch 34, it includes an input 36 for receiving data D" and an input 38 for receiving a clock signal CLK". Input 36 is connected to couple data D" to the gate of a p-channel transistor 40p and the gate of an n-channel transistor 40n. In this regard, therefore, note that one difference of latch 34 versus either of the latch stages of register 30 is that that data for latch 34 drives the gate of a transistor rather than a source/drain of a transistor. Looking to further connections in latch 34, a first source/drain of p-channel transistor 40p is connected to receive a supply voltage, $V_{DD}$, while a second source/drain of p-channel transistor 40p is connected to a first source/drain of a p-channel transistor 42p. A first source/drain of n-channel transistor 40n is connected to ground, while a second source/drain of n-channel transistor 40p is connected to a first source/drain of an n-channel transistor 42n. A second source/drain of both p-channel transistor 42p and n-channel transistor 42n are both connected to a node 44. Additionally, returning to input 38, it is connected directly to the gate of p-channel transistor 42p and to the input of an inverter 46 so that the complement clock signal, $\overline{CLK}$", is connected from the output of inverter 46 to the gate of n-channel transistor 42n. Lastly, node 44 is connected to an input of an inverter 46. The output of inverter 46 is connected to the input of a feedback inverter 48, and the output of feedback inverter 48 is connected to the input of inverter 46. In addition, the output of inverter 46 provides the data output LQ for latch 34.

Having now demonstrated the devices and connections of latch 34, particular attention is drawn to the marking of p-channel transistor 42p and n-channel transistor 42n with asterisks. Thus, consistent with the earlier convention, in the present embodiment these two transistors are LVT transistors while most or all of the remaining transistors in latch 34 are HVT transistors. From this distinction, the operational description below will demonstrate that once more this selective use of LVT transistors improves over latch speed while not adding a current leakage penalty during an active mode for latch 34.

The operation of latch 34 is now described, and given the already-presented discussions should be readily understood without the need for an additional timing diagram. Moreover, latch 34 operates in both an active mode and an inactive mode as was the case with earlier embodiments and, therefore, each of these modes is separately described below.

During the active mode of operation for latch 34, the clock signal CLK" alternates between high and low. When CLK" is low, one or both of p-channel transistor 42p and n-channel transistor 42n conduct (i.e., are in an on state). Moreover, at this time, data D" may be asserted, and this assertion causes either p-channel transistor 40p or n-channel transistor 40n to conduct. Thus, the on state of the clocked transistors 42p and 42n cause one or the other to pass to node 44 a potential from whichever of transistors 40n or 40p are conducting in response to D". For example, if D" is high, then n-channel transistor 40n conducts and a ground potential is passed by n-channel transistor 42n to node 44. Alternatively, if D" is low, then p-channel transistor 40p conducts and a supply potential is passed by p-channel transistor 42p to node 44. In either case, therefore, the combination of the clocked transistors 42p and 42n may be considered an output enable circuit. In other words, here two conditional paths are provided, with one able to pass the voltage provided through p-channel transistor 40p to node 44 and the other able to pass the voltage provided through n-channel transistor 40n to node 44, and the condition may be satisfied when CLK' is low and based on the resulting gate-to-source potential across the transistors in those paths. Moreover, because these two transistors are LVT transistors, they switch faster than compared to an HVT transistor. Accordingly, the speed of latch 34 is improved over that which it would have if constructed of all HVT transistors, as is the case in the prior art. Lastly, once the output enable circuit passes a potential to node 44, that voltage again is referred to herein as an interim voltage because it is then inverted and provided at the latch output LQ. Further, the state at node 44 and output LQ is also maintained by the feedback operation of inverter 48, which combines with inverter 46 to provide a data retention circuit. Accordingly, this state is thereafter preserved during the active mode when CLK" transitions high.

During the inactive mode of operation for latch 34, as in the case for register 30 described earlier, the clock signal CLK" is low. Accordingly, during the inactive mode the operation of latch 34 is comparable to that described in the preceding paragraph of the active mode for the case when CLK" is low. Consequently, during the inactive mode, one or both of p-channel transistor 42p and n-channel transistor 42n conduct. As a result, it is known that the LVT transistors will conduct during this time, but recall once more that for an on device current leakage is not of concern. As a result, during the inactive mode of operation latch 34 does not show excess current leakage even with the selective use of LVT transistors.

Concluding the discussion of FIG. 6, the above demonstrates an alternative embodiment and further demonstrates other possibilities of the inventive scope. For example, the example of the inactive mode of 34 assumes that the clock signal CLK" is low during the inactive mode of operation. If, on the other hand, CLK" were high during the inactive mode, then the transistors of the output enable circuit would be off and, thus, it would not be desirable to form them using LVT transistors due to the potential of higher leakage. By the same notion, however, if it were known that CLK" were intended to be high during the inactive mode, then inverter 46 could be removed from the path between CLK" and n-channel transistor 42n and instead inserted into the path between CLK" and p-channel transistor 42p, again leaving these transistors as LVT transistors. In this alternative, therefore, once more the speed advantage of the LVT transistors would be used during active operation while these same transistors could be on during the inactive mode. Accordingly, these additional considerations should further illustrate the application of the present inventive teachings to other incidences of latches that are either used in registers or formed alone. Further to this latter notion, it is a common practice in some design styles to use separate latches instead of registers. In this approach, each latch belongs to a particular clock phase, that is, it is on (or "transparent") during one of the clock phases, so in a two phase system each latch is either on or off according to a high or low clock state. Accordingly, consistent with the preceding inventive teaches, when a latch is certain to be on in the clock state which corresponds to the inactive mode of operation, then the transistors forming the output enable circuit of that latch are preferably formed using LVT transistors.

Figure 7:
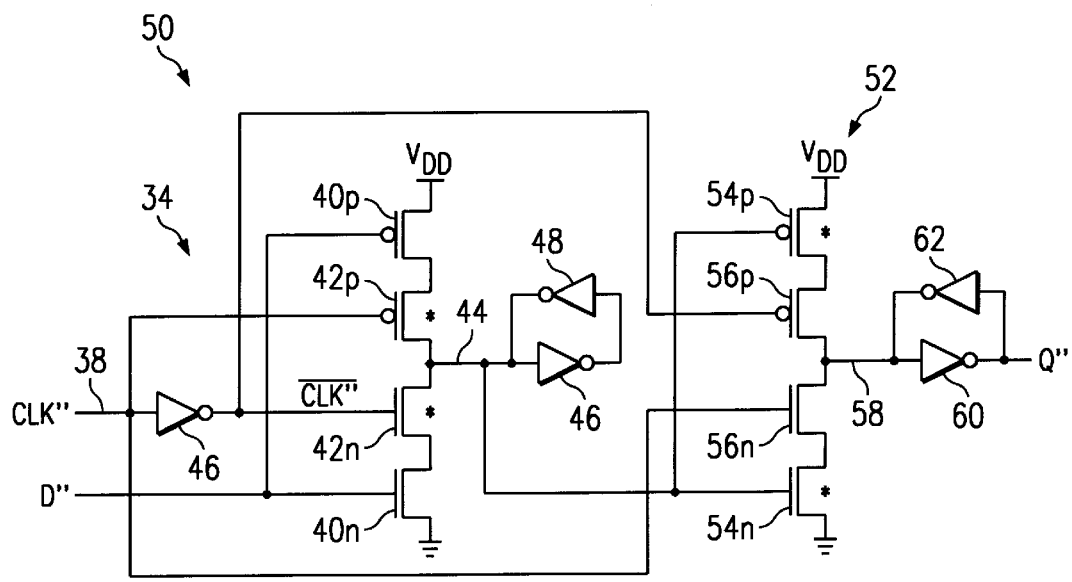
FIG. 7 illustrates a schematic of another embodiment of an inventive register using the latch schematic of FIG. 6.

FIG. 7 illustrates another inventive register designated generally at 50, and which includes the identical connections and structure of latch 34 of FIG. 6 with one exception. Regarding this exception for latch 50, the interim voltage at node 44 of latch 34 is used as a data output for a next stage rather than using the output of inverter 46. This next stage is identified as a second latch 52. More particularly, node 44 of latch 34 is connected to the gates of a p-channel transistor 54p and an n-channel transistor 54n. For reasons detailed later, note in the preferred embodiment that p-channel transistor 54p and an n-channel transistor 54n are LVT transistors. Looking to further connections of these two transistors, a first source/drain of p-channel transistor 54p is connected to receive a supply voltage, $V_{DD}$, while a second source/drain of p-channel transistor 54p is connected to a first source/drain of a p-channel transistor 56p. A first source/drain of n-channel transistor 54n is connected to ground, while a second source/drain of n-channel transistor 54n is connected to a first source/drain of an n-channel transistor 56n. A second source/drain of both p-channel transistor 56p and n-channel transistor 56n are connected to a node 58. Looking to the clocking connections of latch 52, CLK" is connected directly to the gate of n-channel transistor 56n, and its complement $\overline{\text{CLK}}$" is connected to the gate of p-channel transistor 56p. Returning to the data path of latch 52, node 58 is connected to an input of an inverter 60, which has its output connected to the input of a feedback inverter 62 where the output of feedback inverter 62 is connected to the input of inverter 60. In addition, the output of inverter 60 provides the data output Q" for register 50.

The operation of register 50 also occurs in either an active mode when CLK" is transitioning, or during an inactive mode when CLK" is in a fixed known state. Each of these modes is described below, with it assumed that the known state of CLK" during the inactive mode is low. Given the preceding teachings, however, one skilled in the art may readily modify latch 50 to accommodate the instance where the known state of CLK" during the inactive mode is high, while still achieving the enhancements of improved device speed with little or no leakage penalty during the inactive mode of operation.

During the active mode of register 50, the first stage of register 50 operates generally in the same manner as latch 34 described earlier and, thus, the reader is referred to the above for greater detail. Briefly summarizing that operation, when CLK" transitions low, transistors 42n and 42p operate as an output enable circuit to pass a voltage to node 44, where that voltage is responsive to the state of data D". Next, when CLK" transitions high, the voltage at node 44 is maintained by inverters 46 and 48 and, thus, does not change even if there are transitions in data D". The second stage of register 50, as represented by latch 52, operates in a manner complementary to latch 34 in response to transitions in CLK". Thus, when CLK" transitions low, the output enable circuit consisting of p-channel transistor 56p and n-channel transistor 56n turns off and, thus, no change in voltage is passed to node 58; accordingly, the voltage at output Q" also does not change. During this same time, however, recall that the state of D" affects node 44 of latch 34, and the voltage of node 44 is connected to the gates of two LVT transistors, namely, p-channel transistor 54p and n-channel transistor 54n. Because these transistors are LVT transistors, they will respond to any gate change faster than if they were HVT transistors. Next, when CLK" transitions high, the output enable circuit consisting of p-channel transistor 56p and n-channel transistor 56n turns on; as a result, the voltage passed by one of either p-channel transistor 54p or n-channel transistor 54n is output to node 58 as an interim voltage, and is then inverted and retained at output Q" by the retention circuit consisting of inverters 60 and 62.

During the inactive mode of operation for register 50, recall that CLK" is low. Accordingly, during the inactive mode the operation of register 50 is comparable to that described in the preceding paragraph of the active mode for the case when CLK" is low. Consequently, during the inactive mode, the LVT transistors in latch 34 conduct (i.e., in the output enable circuit). Also during the inactive mode, one of the two LVT transistors in latch 52, namely, transistors 54p and 54n, also conducts. As to this latter stage, therefore, note that the conducting LVT transistors are not output enable circuits (which in latch 52 are transistors 56p and 56n), but instead are data enabled transistors. However, they once more represent LVT transistors that are known to conduct during the inactive mode, and again for an on device current leakage is not of concern. Still further, note that the source/drains of transistors 54p and 54n are along a series path between $V_{DD}$ and ground that includes HVT transistors 56p and 56n, and those HVT transistors are off during the inactive mode. Therefore, even if one of the LVT transistors is off during the inactive mode, the higher $V_T$ transistor that is off operates to prevent leakage along the series path. As a result, during the inactive mode of operation register 50 does not show excess current leakage, despite the selective use of LVT transistors.

Figure 8:
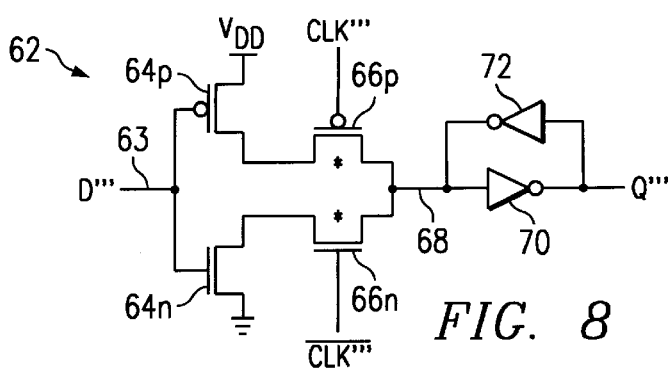
FIG. 8 illustrates a schematic of another embodiment of an inventive register.

FIG. 8 illustrates another embodiment of an inventive latch designated generally at 62, which like latch 34 may be a stand alone latching device or may be used as a stage in a register. Looking to the devices and connections of latch 62, it includes a data input 63 for receiving data D'", and which is connected to the gate of a p-channel transistor 64p and the gate of an n-channel transistor 64n. A first source/drain of p-channel transistor 64p is connected to receive $V_{DD}$, while a second source/drain of p-channel transistor 64p is connected to a first source/drain of a p-channel transistor 66p. A first source/drain of n-channel transistor 64n is connected to ground, while a second source/drain of n-channel transistor 64n is connected to a first source/drain of an n-channel transistor 66n. In the preferred embodiment, both p-channel transistor 66p and n-channel transistor 66n are LVT transistors and, as demonstrated below, form an output enable circuit for latch 62. A second source/drain of both p-channel transistor 66p and n-channel transistor 66 is connected to a node 68. Additionally, the gate of p-channel transistor 66p is connected to receive the clock signal CLK'" and the gate of n-channel transistor 66n is connected to receive the complementary clock signal, $\overline{\text{CLK}}$'". Returning to node 68, it is connected to an input of an inverter 70. The output of inverter 70 is connected to the input of a feedback inverter 72, and the output of feedback inverter 72 is connected to the input of inverter 70. Lastly, the output of inverter 70 provides the data output Q'" for latch 62.

The operation of latch 64 should be appreciated readily by one skilled in the art given the preceding discussions of other embodiments. As in the case of earlier circuits, latch 62 operates in both an active mode and an inactive mode and, thus, each of these modes is separately described below.

During the active mode of operation for latch 62, the clock signal CLK'" alternates between high and low. When CLK'" is low, one or both of p-channel transistor 66p and n-channel transistor 66n conduct. At this time, data D'" may be asserted to thereby cause either p-channel transistor 64p or n-channel transistor 64n to conduct, and the on state of one of the clocked transistors 66p and 66n causes it to pass to node 67 an interim voltage from whichever of transistors 64n or 64p are conducting in response to D'". For this reason, the combination of the clocked transistors 64p and 64n form an output enable circuit consistent with how that term has been used earlier. Additionally, because these two transistors are LVT transistors, they switch faster than compared to an HVT transistor and thereby improve the speed of latch 62 over a prior art device constructed with only HVT transistors. Lastly, once the output enable circuit passes an interim voltage to node 68, it is then inverted and provided at the latch output Q'", and the state at node 68 is also maintained by the operation of the data retention circuit consisting of inverters 70 and 72. Accordingly, this state is preserved during the active mode when CLK'" transitions high.

During the inactive mode of operation, assume again by way of example that the clock signal CLK'" is low.

Accordingly, the inactive mode operation of latch 62 is the same as that during the time periods of the active mode for the case when CLK'" is low. Consequently, during the inactive mode, one or both of p-channel transistor 66p and n-channel transistor 66n conduct, where once more it is known that the LVT transistors conduct during this time. However, for an on device current leakage is not of concern and, therefore, the conduction of the LVT transistors during the inactive mode does not create excess current leakage for latch 62, despite the selective use of LVT transistors.

From the above, it may be appreciated that the above embodiments provide numerous advantages over the prior art. For example, current leakage is reduced while data transition speed is increased. Further, there is not as significant a concern with the drawback of the prior art where reducing current leakage necessarily penalized speed. Still further, there are shown embodiments for reducing current leakage in different types of latches and registers, including those where data drives either a transistor gate or a transistor source/drain. Moreover, the present embodiments span a wide range of examples, as shown by the various Figures as well as the additional statements setting forth other examples as well. Indeed, a person skilled in the art may readily apply the above to still further embodiments not specifically shown above. In this regard, the inventive teachings may apply to more complex circuits where additional circuitry relates to the latch. For example, input/output buffering may be connected to a latch of the types shown herein. As an example of output buffering, an additional inverter may be connected to the output of the data retention circuit where the output of this inverter may therefore be sampled to identify data, thereby isolating or "buffering" the output of the data retention circuit from effects such as capacitive loading which might affect the data. As an example of input buffering, an additional inverter may be connected to the input of the latch to buffer input signals from falling below ground which, without the input buffer, could erroneously affect the stored data value. As still another example of additional circuitry relating to a latch, multiple input passgates could be provided to a given input node. As a specific example, data from different sources may be coupled via different and respective passgates to a single latch node. As another specific example, a scan input may be connected as an alternative input to a latch via a separate passgate for testing purposes (e.g., debugging and manufacturing testing). Consequently, while the present embodiments have been described in detail, various substitutions, modifications or alterations could be made to the descriptions set forth above without departing from the inventive scope which is defined by the claims set forth below.

What is claimed is:

1. A data storage circuit comprising:
    a data input for receiving a data voltage;
    a node for receiving an interim voltage in response to the data voltage;
    an output enable circuit for providing at least one conditional path coupled to the node and for coupling the interim voltage to the node, wherein the output enable circuit comprises
        a first conditional path comprising a first transistor having a first threshold voltage,
        a second conditional path comprising a second transistor having the first threshold voltage,
        wherein a first source/drain of the first transistor and a first source/drain of the second transistor are connected to the data input and
        wherein a second source/drain of the first transistor and a second source/drain of the second transistor are connected to the node;
    a data output for providing an output voltage in response to the interim voltage at the node;
    a data retention circuit coupled between the node and the data output, wherein the data retention circuit comprises at least one transistor having a second threshold voltage higher in magnitude than the first threshold voltage;
    an input for receiving a clock signal, the clock signal having an active mode transitions between a first predetermined state and a second predetermined state and an inactive mode remaining at the first predetermined state;
    wherein the first transistor is coupled to receive the clock signal;
    wherein the second transistor is coupled to receive a complement of the clock signal from a clock inverter; and
    wherein the clock inverter comprises:
        a p-channel transistor having a first source/drain coupled to a first voltage potential and a second source/drain coupled to a node that provides the complement of the clock signal, wherein the p-channel transistor has the first threshold voltage; and
        an n-channel transistor having a first source/drain coupled to a second voltage potential different than the first voltage potential, and a second source/drain coupled to the node that provides the complement of the clock signal, wherein the n-channel transistor has the second threshold voltage; and
    wherein in the active mode the clock signal alternately enables and disables the first and second transistors to provide the conductive path along the at least one conductive path and in the inactive mode the clock signal enables the first and second transistors to provide the conductive path along the at least one conditional path.

2. A data storage circuit comprising:
    a first data input for receiving a first data voltage;
    a first node for receiving a first interim voltage in response to the first data voltage;
    an first output enable circuit for providing at least one conditional path coupled to the first node and for coupling the first interim voltage to the first node, wherein the first output enable circuit comprises a first transistor having a first threshold voltage and operable to provide a conductive path along the at least one conditional path;
    a first data output for providing a first output voltage in response to the first interim voltage at the first node;
    a first data retention circuit coupled between the first node and the first data output, wherein the first data retention circuit comprises at least one transistor having a second threshold voltage higher in magnitude than the first threshold voltage;
    a second data input for receiving the first output voltage;
    a second node for receiving a second interim voltage in response to the first output voltage;
    a second output enable circuit for providing at least one conditional path coupled to the second node and for coupling the second interim voltage to the second node, and wherein the second output enable circuit comprises a first conditional path comprising a first transistor; and a second conditional path comprising a second transistor;

wherein a first source/drain of the first transistor of the second output enable circuit and a first source/drain of the second transistor of the second output enable circuit are connected to the second data input; and wherein a second source/drain of the first transistor of the second output enable circuit and a second source/drain of the second transistor of the second output enable circuit are connected to the second node;

wherein the first transistor of the second output enable circuit and the second transistor of the second output enable circuit both have the second threshold voltage;

a second data output for providing a second output voltage in response to the second interim voltage at the second node; and a second data retention circuit coupled between the second node and the second data output.

3. The data storage circuit of claim 2 wherein the second data retention circuit comprises:

a first inverter having an input connected to the second node and an output connected to the second data output; and a second inverter having an input connected to the second data output and an output connected to the input of the first inverter of the second data retention circuit.

* * * * *